(12) United States Patent
Chungpaiboonpatana et al.

(10) Patent No.: US 6,225,681 B1
(45) Date of Patent: May 1, 2001

(54) MICROELECTRONIC INTERCONNECT STRUCTURES AND METHODS FOR FORMING THE SAME

(75) Inventors: Surasit Chungpaiboonpatana, Irvine; Craig Davidson, Foothill Ranch, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/390,445

(22) Filed: Sep. 7, 1999

(51) Int. Cl.⁷ .............................. H01L 23/58; H01L 23/48
(52) U.S. Cl. ...................... 257/642; 257/751; 257/752
(58) Field of Search ........................... 257/642, 643, 257/736, 759, 760, 772, 779, 780, 781, 784; 438/82, 612, 614, 617, 725

(56) References Cited

U.S. PATENT DOCUMENTS

| | | | |
|---|---|---|---|
| 3,935,366 | 1/1976 | Smith | 428/328 |
| 4,555,746 * | 11/1985 | Mochizuki et al. | 361/323 |
| 5,624,864 * | 4/1997 | Arita et al. | 438/3 |
| 5,785,236 | 7/1998 | Cheung et al. | 228/180.5 |
| 5,969,422 * | 10/1999 | Ting et al. | 257/762 |

OTHER PUBLICATIONS

IEDM Scrutinizes Craze Over Copper Interconnections; David Lammers Dec. 15, 1997; Source: Electronic Engineering Times.

* cited by examiner

Primary Examiner—Steven Loke
Assistant Examiner—Hung Kim Vu
(74) Attorney, Agent, or Firm—Snell & Wilmer

(57) ABSTRACT

An improved microelectronic interconnect structure and methods for forming the structure are disclosed. The microelectronic interconnect structure includes an organic-based coating that facilitates formation of electrical connections to the structure. The coating may be used to reduce oxidation of copper interconnects, which allows wire or bump attachment to the copper interconnect using conventional wire bonding or bump interconnect methods and apparatus. The coating is applied during a post chemical mechanical polishing process by placing the interconnect structure into a solution.

8 Claims, 3 Drawing Sheets

MICROELECTRONIC INTERCONNECT STRUCTURES AND METHODS FOR FORMING THE SAME

FIELD OF THE INVENTION

The present invention generally relates to microelectronic devices and device fabrication methods. More particularly, the present invention relates to microelectronic devices including interconnect structures and to methods for forming the interconnect structures.

BACKGROUND OF THE INVENTION

Microelectronic devices often include a layer of conductive material on or proximate a surface of the device to facilitate electrical connections to the device. The layer of conductive material typically includes several interconnect structures and is often referred to as an interconnect layer or level because it is configured to couple one or more conductive or semiconductive layers within the device to an apparatus external to the device such as an electronic package, a substrate, or the like.

Interconnect layers typically include a thin, patterned layer of aluminum or aluminum copper (having less than about 5% copper) and are formed by depositing the aluminum onto a surface of the device, patterning the aluminum with photoresist, and etching the patterned aluminum to form the interconnect structures. Dielectric material such as silicon oxide, silicon nitride; low dielectric constant materials such as BCB, SiOF, SILK, or FLARE; or a combination of any of these materials is then deposited over the interconnect structures and vias are formed through the dielectric material to allow electrical connections to the interconnect structures.

Electrical connection to the interconnect structure is often formed by attaching one end of a thin metal wire to the interconnect structure and the other end of the wire to an external apparatus such as a substrate, a leadframe, or the like; this process is referred to as wire bonding.

Wire bonding typically includes placing the wire in contact with the aluminum interconnect structure (typically at an elevated temperature) and moving the wire relative to the structure at high speed (e.g., by applying ultrasonic vibration to the wire) to bond the wire to the interconnect structure. Application of ultrasonic vibration assists in bonding the wire to the interconnect structure by, among other things, moving the wire across the surface of the interconnect structure to break aluminum oxides that form on the surface of the structure, allowing the wire to bond to the aluminum metal. Also, moving the wire relative to the interconnect surface assists chemical and mechanical bond formation between the wire and the structure.

Although other methods and apparatus may be used to form electrical connections to the device, wire bonding is often preferable because, among other reasons, the technology is well understood and many device packagers already have wire bonding equipment in place, making wire-bond based packaging relatively inexpensive and reliable. Accordingly, methods and apparatus for forming electrical connections to a microelectronic device may desirably include wire bonding.

As the size of microelectronic devices decreases (e.g., to increase device speed or increase the number of devices per surface area of a wafer on which the devices are formed) aluminum interconnect structures become increasingly less desirable. In particular, as device size and corresponding interconnect structure sizes are reduced, an amount of current per unit area (current density) that each structure must transport increases, and as the current density increases, electromigration of the aluminum structures increases. In addition, the resistance in the structures increases as the structure size decreases, causing the devices to heat during use and reducing the performance of the device (e.g., by increasing power consumption of the device).

Recently, copper interconnect structures have been developed to overcome many of the shortcomings of aluminum interconnect structures. Use of copper to form the structures is advantageous because copper has higher resistance to electromigration and lower electrical resistance compared to aluminum. However, integration of copper processes in microelectronic formation has been problematic. In particular, wire bonding to the copper interconnect structures has been arduous.

Forming wire bonds to copper interconnect structures is difficult, in part, because unlike aluminum oxides that form on the surface of aluminum interconnect structures, copper oxides do not readily break during the wire bonding process to allow the wire to bond to the structure. Rather, the copper oxides often act as a lubricant when the wire is placed in contact with and moved relative to the interconnect structure, making bonding of the wire to the copper structure difficult.

Prior art methods for improving bonds between the copper interconnect and the wire include coating a surface of the copper interconnect structure with a metal such as aluminum or combinations of nickel and gold. Although these materials may provide a suitable surface for the wire to attach, the metals are generally less conductive than copper and require additional device manufacturing steps to deposit and pattern the metals on the wafer surface. Using metals that are less conductive than copper mitigates at least some of the advantages associated with using copper to form the interconnect structure such as increased device speed and lower power consumption, and using additional processing steps undesirably increases fabrication costs associated with manufacturing the microelectronic devices. Accordingly, microelectronic devices including improved interconnect structures and methods for forming the structures are desirable.

SUMMARY OF THE INVENTION

The present invention provides improved microelectronic devices and methods for forming the devices. More particularly, the present invention provides improved microelectronic device interconnect structures and methods for forming the structures.

The way in which the present invention addresses the drawbacks of the now-known interconnect structures will be described in greater detail hereinbelow. However, in general, the improved interconnect structures are formed of a low resistance material, are resistant to electromigration, and provide a surface suitable for bonding to wires or solder bumps.

In accordance with an exemplary embodiment of the present invention, an interconnect structure is formed from copper metal, and a surface of the structure is coated with a material to provide a surface on the structure suitable for bonding to a wire or a bump. In accordance with a further aspect of this embodiment, the coating material includes organic components.

In accordance with another exemplary embodiment of the present invention, a material that facilitates bonding of a wire or a bump to an interconnect structure is deposited onto the structure in a liquid form. In accordance with a further aspect of this embodiment, the material is deposited onto a surface of the interconnect structure during the final wafer processing steps.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to microelectronic interconnect structures formed on a surface of a wafer and methods for forming the interconnect structures. Although the interconnect structures may be formed in a variety of ways such as by plating the structures onto a surface of the wafer (with photoresist as a plating mask), using deposition and etch techniques, or metal lift off techniques, the invention is conveniently described hereinbelow in connection with interconnect structures formed using chemical mechanical polishing or damascene methods.

Figure 1:
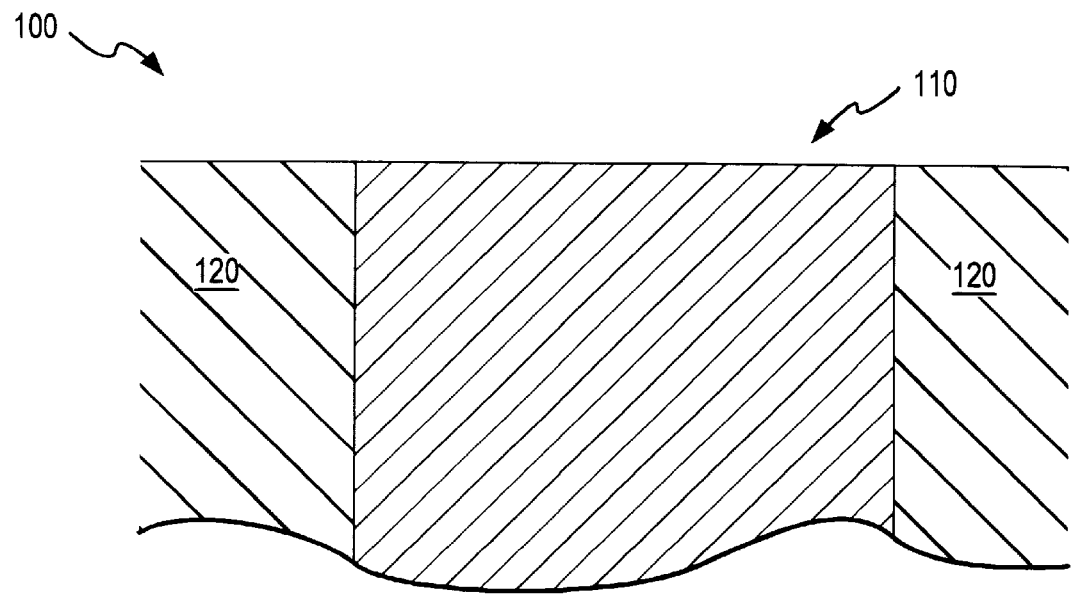
FIG. 1 illustrates a cross-sectional view of a portion of a microelectronic device including an interconnect structure in accordance with the present invention.

FIG. 1 illustrates, in cross section, a portion of a microelectronic device 100, including an interconnect structure 110 and insulating material 120 in accordance with the present invention. The device may include a transistor, any other electronic component, or any combination of components. Although not shown in FIG. 1, the device may include one or more interconnect structures and one or more semiconducting, semiinsulating, conducting, or insulating layers adjacent to or beneath structure 110. For example, the device may include multiple conducting layers that are integrated and coupled to one or more structures 110 to form an integrated device.

Structure 110 is suitably configured to facilitate electrical coupling to the device. In particular, structure 110 couples one or more conductive layers on or within the device to an apparatus such as a package or a substrate that is external to the device. Accordingly, structure 110 includes conductive material. In accordance with an exemplary embodiment of the present invention, structure 110 includes conductive material with relatively low electrical resistance and relatively high resistance to electromigration such as copper or other metals or alloys containing copper. However, structure 110 may include other metals or conductive compounds.

Figure 2:
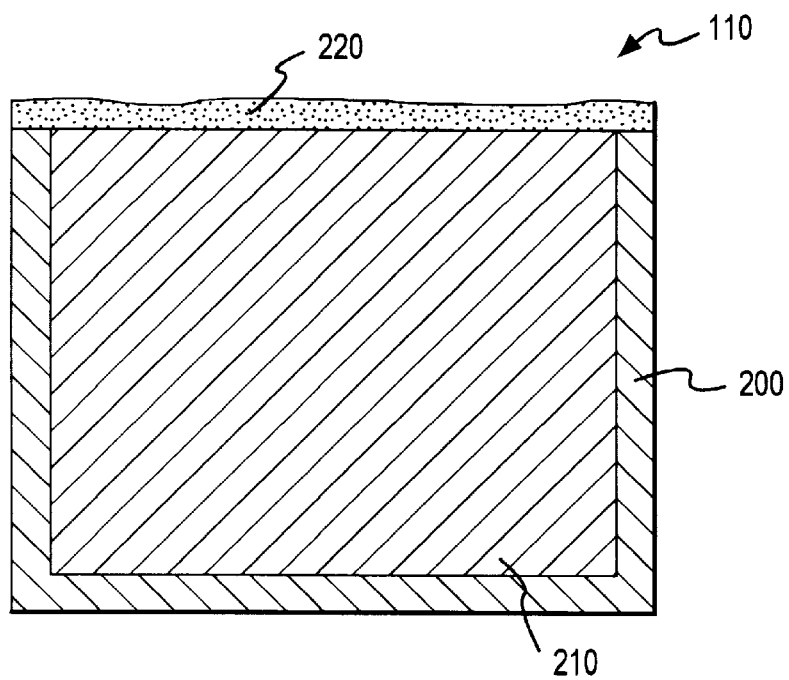
FIG. 2 illustrates a more detailed cross-sectional view of the interconnect structure of FIG. 1.

FIG. 2 illustrates structure 110 in accordance with the present invention in greater detail. Exemplary structure 110 includes a barrier layer 200, a plug 210, and a coating 220. Although coating 220 is shown as covering only structure 110, coating 220 may suitably cover an entire wafer surface, wherein the wafer includes several microelectronic devices and corresponding structures 110.

Barrier layer 200 is configured to prevent unwanted migration of plug 210 material to other portions of the device, and therefore, the composition of barrier layer 200 may depend on the composition of plug 210. As described in more detail below, plug 210 preferably includes copper; accordingly, layer 200 preferably includes material that is substantially resistant to diffusion of copper. Copper diffusion resistant materials that may be used to form layer 200 include, but are not limited to tantalum, tantalum nitride, and combinations thereof. Although the thickness of layer 200 may depend on material used to form plug 210 and the device application, in accordance with a preferred embodiment of the present invention, layer 200 is formed of tantalum nitride and is about 10 nm to about 20 nm, and more preferably about 15 nm thick. Layer 200 may be formed using a variety of methods such as by plating, chemical vapor deposition, or physical vapor deposition. However, layer 200 is preferably formed by depositing layer 200 material using physical vapor deposition.

As noted above, plug 210 preferably includes copper metal. The thickness of the copper may vary from application to application; however, in accordance with a preferred exemplary embodiment of the present invention, the copper layer is about 1 to about 1.5 and more preferably about 1.26 $\mu$m thick. Although copper for plug 210 may be deposited onto portion 100 using a variety of techniques, the copper is preferably deposited by plating the copper onto the surface of portion 100.

Figure 3:
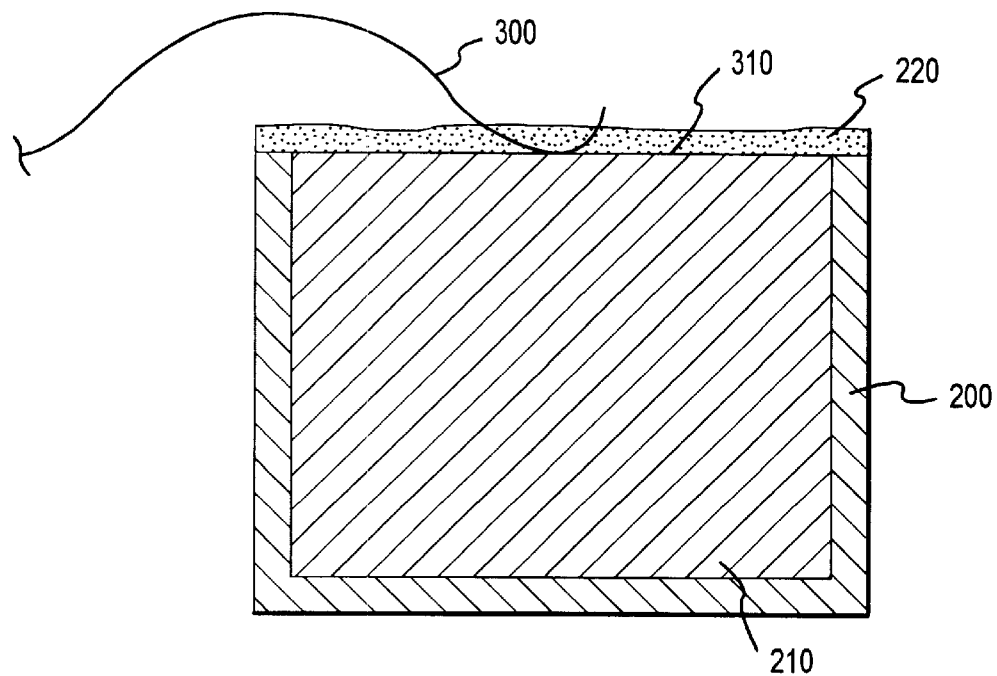
FIG. 3 illustrates an interconnect structure having a wire attached thereto in accordance with the present invention.

Coating 220 is configured to facilitate electrical connection to plug 210. Although electrical contact to plug 210 may be formed in a variety of ways such as, for example, forming solder bumps on a surface of plug 210, in accordance with an embodiment of the present invention and as illustrated in FIG. 3, a wire 300 is coupled to plug 210 to form an electrical connection to plug 210.

Coating 220 may facilitate forming a bond to plug 210 in a variety of ways. For example, coating 220 may react with plug 210 to form a material that is brittle and breaks away as wire 300 bonds to plug 210, and/or coating 220 may act as a passivation layer, reducing oxide formation on a surface 310 of plug 210. Oxides (e.g., cupric and/or cuprous oxide) readily form on surface 310 and are thought to deleteriously affect bonding between wire 300 and surface 310 because the copper oxides are not friable. Because the oxides are not friable, they do not break away as wire 300 is placed in contact with and moved relative to surface 310. As discussed in more detail below, after plug 210 is coated, portion 100 may go through several more fabrication steps, some of which may be at elevated temperatures. If such is the case, the material used to form coating 220 is preferably configured to facilitate bond formation to plug 210 after exposure to subsequent device manufacturing processes. In accordance with a preferred embodiment of the present invention, coating 220 material is configured to facilitate bond formation between wire 300 and plug 210 after exposure to temperatures of up to about 200° C.

In part because it is often difficult to remove all copper oxide from a copper surface, coating 220 is configured to bond to both native copper and copper oxides in accordance with an exemplary embodiment of the present invention. Suitable exemplary coatings 220 for bonding to copper and oxides of copper include compounds having $NH_2$ and $NH_3$.

Although a variety of materials may be used for coating 220, coating 220 preferably includes an organic compound. Organic compounds suitable for use in connection with the present invention include benzotriazine (BTA), monoethanolamine (MEA), a BTA-MEA mixture that forms an equimolar salt when mixed together, a BTA-formic acid-MEA mixture, or any combination of these compounds which may be present in a solvent (e.g., an organic solvent such as a glycerin-based solution).

The thickness of coating 220 may vary from application to application and may depend on the type of electrical connection (e.g., solder bump, wire bond, or the like) formed between plug 210 and an external apparatus. In general, the thickness is selected such that coating 220 facilitates bond formation to plug 210. If coating 220 is too thin, oxide formation may occur even in the presence of coating 220, and if coating 220 is too thick, formation of an electrical connection to plug 210 may be difficult. The thickness of coating 220 may also depend on the type of material used to form coating 220. Nevertheless, in accordance with a preferred exemplary embodiment of the present invention, coating 220 includes benzotriazine and is about 0.1 to about 2.0 nm, more preferably about 0.5 to about 1.5 nm, and yet more preferably about 1.0 nm thick.

An exemplary method for forming an interconnect in accordance with the present invention suitably includes a conductive plug formation step and a coat step.

Figure 4:
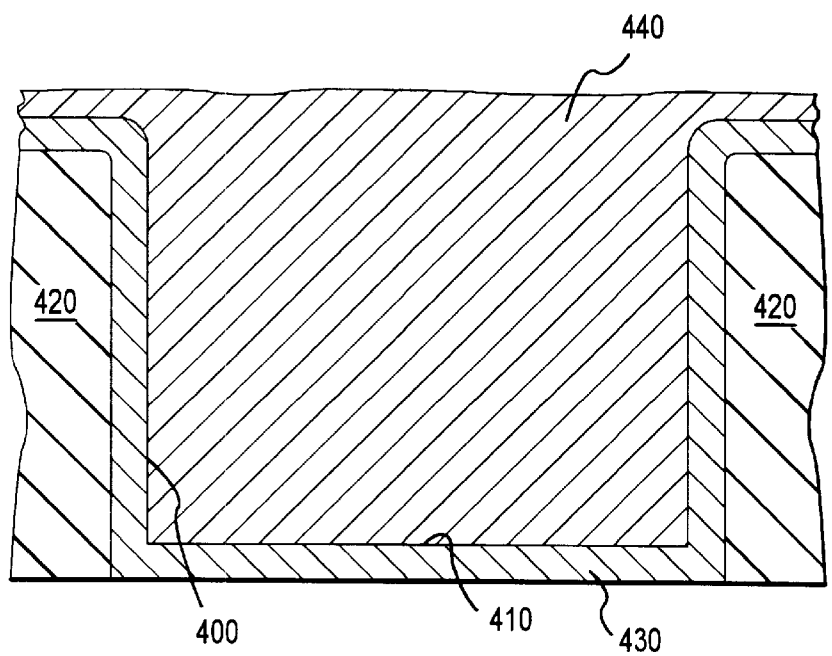
FIG. 4 illustrates a portion of a semiconductor wafer having a trench formed within an insulating layer and a barrier material and a conductive material deposited onto the surface of the wafer in accordance with the present invention.

The conductive plug formation step may include a variety of processes such as deposition, pattern, etch, and plate steps. In accordance with a preferred embodiment of the present invention, which is illustrated in FIG. 4, plug formation step includes substeps of forming a trench defined by walls 400 and 410 within an insulating material 420, depositing barrier material 430 using physical vapor deposition processes (e.g., using sputter deposition), and plating a conductive material 440 such as copper to a desired thickness.

Figure 5:
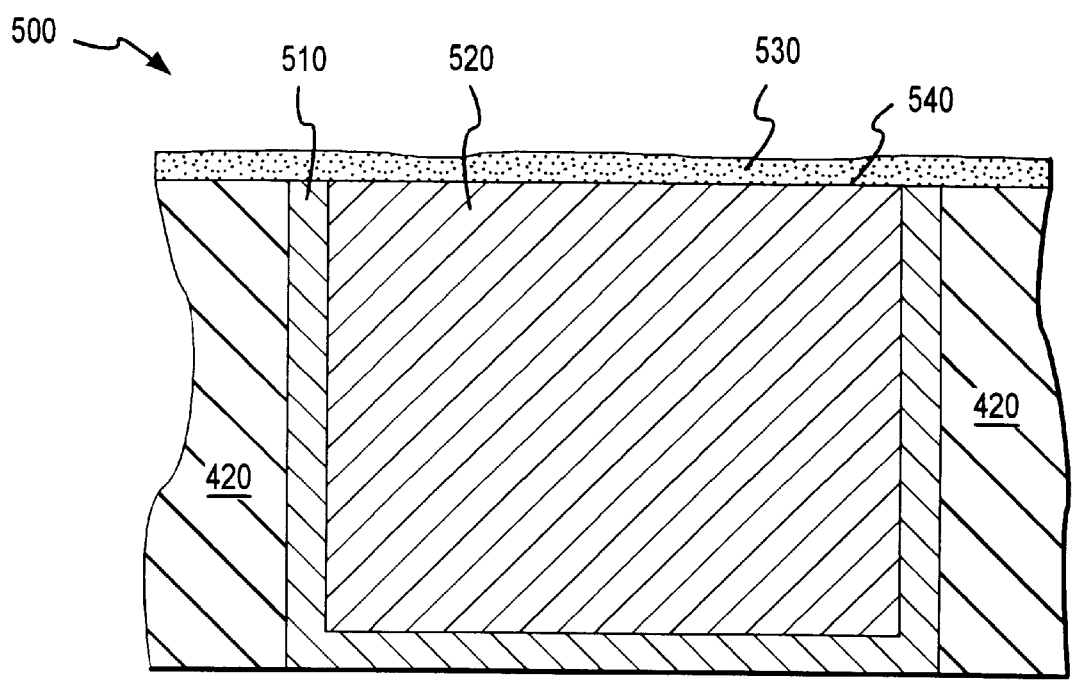
FIG. 5 illustrates an interconnect structure including a coating in accordance with the present invention.

Next, excess barrier material 430 and conductive material 440 are removed using chemical mechanical polishing to form an interconnect structure 500, which is illustrated in FIG. 5. Interconnect structure 500 includes a barrier layer 510 and a conductive plug 520 surrounded by insulating material 420. The conductive plug formation step may also include a wafer or device cleaning step. However, as discussed in more detail below, the coat step preferably includes a wafer cleaning step.

In accordance with an exemplary embodiment of the present invention, during the coat step, a material 530 configured to assist electrical connection to plug 520 (e.g., by retarding or preventing the growth of oxide on plug 520) is applied to a surface 540 of plug 520. Material 530 may be applied to surface 540 using a variety of methods such as physical vapor deposition, spin-on techniques, or dipping. However, in accordance with a preferred exemplary embodiment of the present invention, material 530 is applied to surface 540 during a wafer clean and passivation process such as a post chemical mechanical polishing clean and deposit process. Applying material 530 during the post chemical mechanical polishing process is advantageous because the application does not require any additional apparatus or process steps in addition to those used to form prior-art interconnect structures. Indeed, the present invention may actually require fewer process steps than prior art methods for forming copper interconnect structures.

Material 530 is preferably applied to surface 540 before substantial oxidation occurs on the surface of plug 520. Accordingly, an amount of time the wafer spends between the interconnect formation step and the coat step is preferably controlled or minimized. In addition, solution including organic material that forms coating 530 preferably includes components such as HF and/or $HNO_3$ to dissolve oxides or other bond formation inhibiting compounds present on plug 520.

Material 530 is applied to surface 540 by exposing surface 540 to a solution including organic compounds such as benzotriazine and glycerin. The solution may also include chemicals configured to remove debris from the wafer surface such as a mixture containing one or more of the following compounds: HF, $H_2SO_4$, HCl, acetic acid. In accordance with the present invention, the solution includes about 60 to 90% benzotriazine, about 10 to 40% glycerin, about 1 to 2% deionized water, and various buffering agents, if desired. In accordance with an exemplary embodiment of the present invention, the solution is maintained at a pH less than about 5 to prevent undesired copper oxidation.

Typical post chemical mechanical polishing cleaning apparatus may be used to deposit material 530 onto surface 540. For example, a Lam Research post CMP cleaning machine or an OnTrack PCMP System may be used to deposit material 530 onto surface 540. However, apparatus such as dip tanks, spray tools, and physical vapor deposition equipment may be used to deposit material 530 on surface 540 in accordance with the present invention.

Although the present invention is set forth herein in the context of the appended drawing figures, it should be appreciated that the invention is not limited to the specific form shown. For example, while the inventive interconnect structure is conveniently described above in connection with a copper-based conductive plug, various other compounds such as aluminum may be used to form the interconnect structure in accordance with the present invention. Various other modifications, variations, and enhancements in the design and arrangement of the microelectronic interconnect structures as set forth herein may be made without departing from the spirit and scope of the present invention.

We claim:

1. A microelectronic device formed on a surface of a substrate comprising:

a conductive plug formed within an insulating layer; and a coating covering at least part of a surface of said conductive plug, wherein said coating consists essentially of organic compounds and is configured to assist electrical coupling to said conductive plug wherein said organic compounds include benzotriazine.

2. The microelectronic device of claim 1, wherein said conductive plug includes copper.

3. The microelectronic device of claim 1, further comprising a barrier layer adjacent said conductive plug.

4. The microelectronic device of claim 3, wherein said barrier layer includes tantalum nitride.

5. The microelectronic device of claim 1, wherein said coating has a thickness of about 0.1 nm to about 2.0 nm.

6. The microelectronic device of claim 5, wherein said coating has a thickness of about 1.0 nm.

7. The microelectronic device of claim 1, wherein said organic compounds include a material of an organic solvent.

8. The microelectronic device of claim 7, wherein said solvent includes glycerine.

* * * * *